(12) United States Patent
Mülders et al.

(10) Patent No.: US 12,492,797 B2
(45) Date of Patent: Dec. 9, 2025

(54) FLEXIBLE THREE DIMENSIONAL DISPLAY ASSEMBLY FOR ELECTRIC VEHICLES

(71) Applicant: LUMILEDS LLC, San Jose, CA (US)

(72) Inventors: Barbara Roswitha Mülders, Aachen (DE); Udo Karbowski, Aachen (DE)

(73) Assignee: Lumileds Singapore Pte. Ltd., Singapore (SG)

( * ) Notice: Subject to any disclaimer, the term of this patent is extended or adjusted under 35 U.S.C. 154(b) by 165 days.

(21) Appl. No.: 18/340,451

(22) Filed: Jun. 23, 2023

(65) Prior Publication Data

US 2023/0417387 A1 Dec. 28, 2023

Related U.S. Application Data

(60) Provisional application No. 63/355,339, filed on Jun. 24, 2022.

(51) Int. Cl.
*F21S 43/15* (2018.01)
*F21S 43/14* (2018.01)
*F21S 43/19* (2018.01)
*F21W 104/00* (2018.01)
*F21Y 107/20* (2016.01)
(Continued)

(52) U.S. Cl.
CPC .............. *F21S 43/15* (2018.01); *F21S 43/14* (2018.01); *F21S 43/195* (2018.01); *F21W 2104/00* (2018.01); *F21Y 2107/20* (2016.08); *F21Y 2107/70* (2016.08); *F21Y 2115/10* (2016.08)

(58) Field of Classification Search
CPC ...... B60Q 1/0088–28; B60Q 1/50–549; F21W 2104/00; F21Y 2107/20–70; G09F 9/301–3023; G09F 9/33; G09F 21/04–0485
See application file for complete search history.

(56) References Cited

U.S. PATENT DOCUMENTS

| 5,043,716 A | 8/1991 | Latz et al. |
| 6,201,316 B1 | 3/2001 | Knecht |
| 8,411,229 B2 | 4/2013 | Choo et al. |
| (Continued) | | |

FOREIGN PATENT DOCUMENTS

FR 3097936 1/2021

OTHER PUBLICATIONS

Communication Relating to the Results of the Partial International Search mailed on Oct. 12, 2023 for PCT International Application No. PCT/US2023/026098.
(Continued)

*Primary Examiner* — Jason M Han
(74) *Attorney, Agent, or Firm* — Volpe Koenig

(57) ABSTRACT

A flexible three dimensional display assembly is provided. The flexible display assembly includes electrically interconnected light emitting elements, a flexible lattice fixture and a display bezel. The light emitting elements are electrically interconnected by a system of conductors. The light emitting elements are coupled to the flexible lattice fixture by an arrangement of structurally interconnected framing cells that receive pairs of the light emitting elements. The flexible lattice fixture is secured to the substrate of the display bezel such that the pairs of light emitting elements are maintained in optical alignment with corresponding pairs of apertures of the display bezel.

14 Claims, 14 Drawing Sheets

(51) Int. Cl.
  *F21Y 107/70* (2016.01)
  *F21Y 115/10* (2016.01)

(56) References Cited

U.S. PATENT DOCUMENTS

| | | |
|---|---|---|
| 11,380,730 B2 * | 7/2022 | Monestier .............. B60Q 1/543 |
| 2003/0112627 A1 * | 6/2003 | Deese ................. F21V 21/0832 |
| | | 362/800 |
| 2015/0339845 A1 | 11/2015 | Privsek et al. |
| 2019/0248274 A1 | 8/2019 | Salter et al. |
| 2020/0035134 A1 | 1/2020 | Pahlevaninezhad et al. |
| 2020/0408382 A1 | 12/2020 | Kleijnen et al. |
| 2021/0167047 A1 | 6/2021 | Lee |
| 2023/0304644 A1 | 9/2023 | Spinger et al. |
| 2023/0417387 A1 | 12/2023 | Mülders et al. |
| 2024/0151384 A1 | 5/2024 | Chen et al. |

OTHER PUBLICATIONS

International Search Report and Written Opinion mailed on Jul. 11, 2023 for PCT International Application No. PCT/US2023/016240.

\* cited by examiner

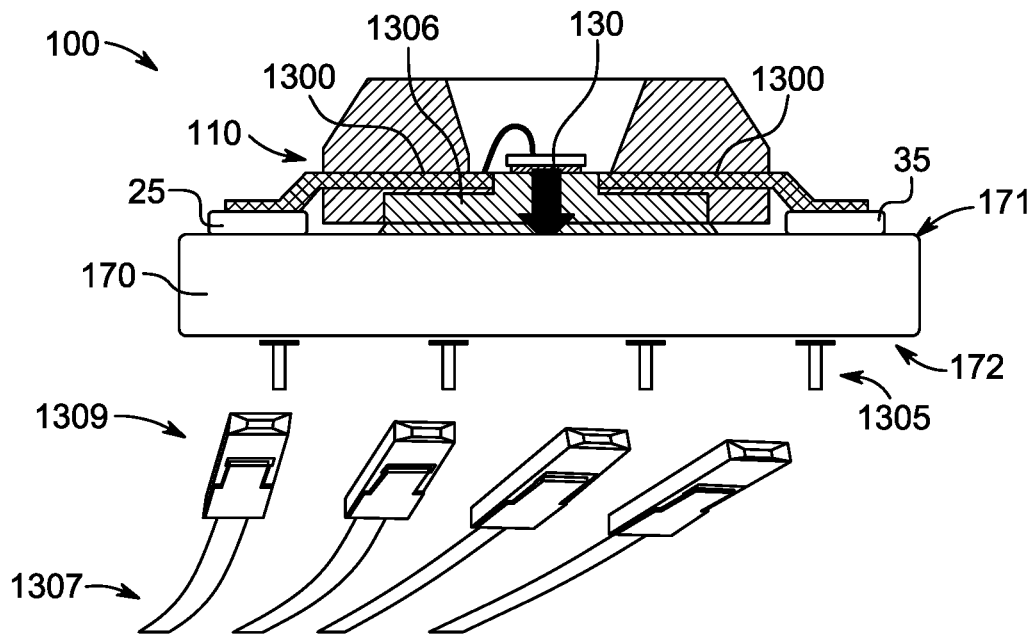
FIG. 8
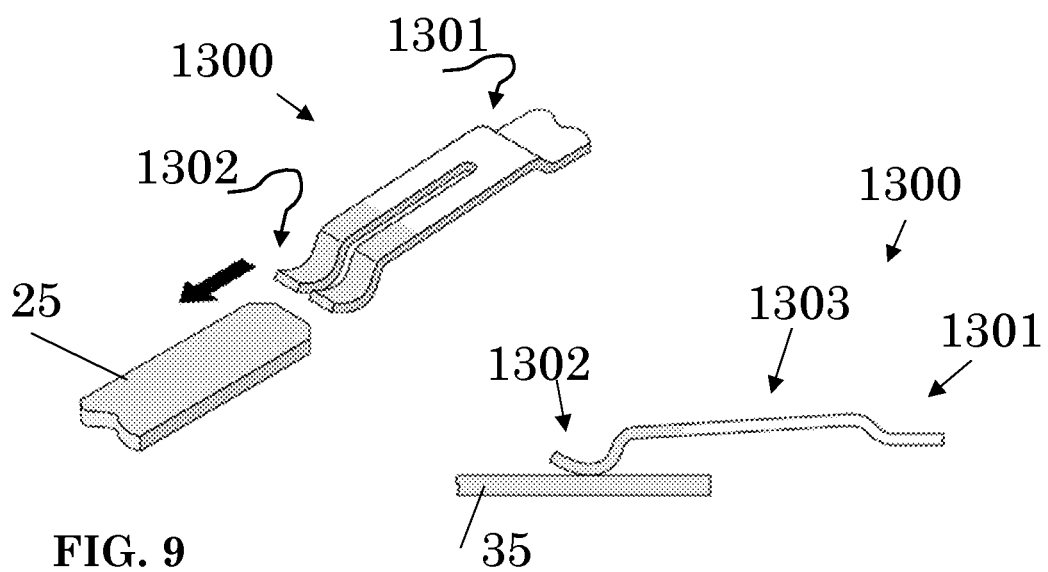
FIG. 9
FIG. 10

FLEXIBLE THREE DIMENSIONAL DISPLAY ASSEMBLY FOR ELECTRIC VEHICLES

CROSS REFERENCE TO RELATED APPLICATIONS

This application claims the benefit of U.S. Provisional Appln. No. 63/355,339, filed on Jun. 24, 2022, the contents of which are incorporated herein by reference. This application relates to U.S. application Ser. No. 18/189,431, filed on Mar. 24, 2023, which claims the benefit of U.S. Provisional Appln. No. 63/323,739, filed on Mar. 25, 2022.

BACKGROUND

A grille may cover an opening in the body of a vehicle to allow air to flow into and out of the opening to circulate cooling air to the vehicle's internal combustion engine to prevent overheating. The grille may also provide a visual design to the front of the car that may attract buyers and allow buyers to identify the make and model of the vehicle. For all-electric vehicles with electric motors, a grille may be obsolete and unnecessary.

SUMMARY

A flexible three dimensional display assembly is provided. The flexible display assembly includes electrically interconnected light emitting elements, a flexible lattice fixture and a display bezel. The light emitting elements are electrically interconnected by a system of conductors. The light emitting elements are coupled to the flexible lattice fixture by an arrangement of structurally interconnected framing cells that receive pairs of the light emitting elements. The flexible lattice fixture is secured to the substrate of the display bezel such that the pairs of light emitting elements are maintained in optical alignment with corresponding pairs of apertures of the display bezel.

BRIEF DESCRIPTION OF THE DRAWINGS

A more detailed understanding can be had from the following description, given by way of example in conjunction with the accompanying drawings wherein:

FIG. 8 is a pictorial illustration of another example light emitting element coupled to an electrical conductor;

FIGS. 9 and 10 are pictorial illustrations of an example spring clip providing electrical interconnection in embodiments described herein;

DETAILED DESCRIPTION

Examples of different light illumination systems and/or light emitting diode (LED) implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Figure 1:
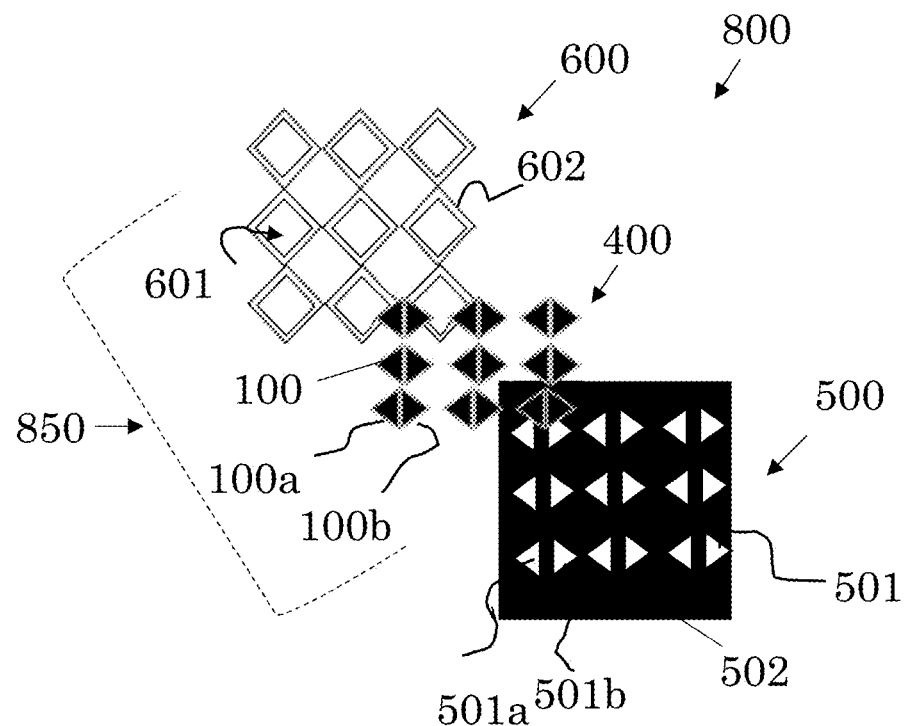
FIG. 1 is an exploded perspective view of components of a flexible display assembly.

FIG. 1 is an exploded view of a flexible three dimensional (3D) display assembly 800. In the example illustrated in FIG. 1, the flexible display assembly 800 includes a flexible lattice fixture 600, an arrangement 400 of electrically interconnected light emitting elements 100 and a display bezel 500.

The flexible lattice fixture 600 may include multiple structurally interconnected framing cells 602. Each respective framing cell 602 may define a respective corresponding opening 601 formed to receive a respective, corresponding pair 100a, 100b of light emitting elements 100. Lighting emitting elements 100 can be attached to the flexible lattice fixture 600 by any suitable fixation technique, including, for example, laser soldering, heat staking, and/or clip systems, thereby forming a subassembly 850 in which structurally interconnected framing cells 602 including the flexible lattice fixture 600 may mechanically support electrically interconnected light emitting elements 100 in an arrangement 400.

The example flexible lattice fixture 600 shown in FIG. 1 includes nine framing cells 602 defining nine corresponding openings 601. In the example illustrated in FIG. 1, the flexible lattice fixture 600 arranges nine pairs of light emitting elements 100, or 18 individual light emitting elements 100, into three rows of three columns. However, the arrangement and number of framing cells 602 and lighting elements 100 in the example of FIG. 1 is selected for ease of illustration and discussion only. In practical embodiments, the flexible lattice fixture 600 can include any desired number of framing cells 602 to define a wide range of arrangements 400 of light emitting elements 100.

The display bezel 500 may include a substrate 502 defining an arrangement of pairs (example pair indicated at 501a, 501b) of apertures 501. The arrangement of aperture pairs of the display bezel 500 may correspond to an arrangement 400 of light emitting elements 100 in that every pair of light emitting elements 100a, 100b supported by a framing cell 602 may have a corresponding pair of apertures 501a, 501b in the display bezel 500. The display bezel 500 may be constructed of plastic, metal, or layers of these materials, and the apertures 501 may be formed by molding the display bezel substrate 502. Aperture pairs 501a 501b can be arranged in any desired orientation, such as side by side along a lateral axis of the display bezel 500 or top to bottom along a longitudinal axis of the display bezel 400, as long as the orientation of the aperture pairs 501a and 501b corresponds to the orientation of pairs of light emitting elements 100a and 100b on the flexible lattice fixture 600.

Electrically interconnected light emitting elements 400 can be securely coupled to the flexible lattice fixture 600 to form a sub-assembly 850. The subassembly 850 can then be attached to the substrate 502 of the display bezel 500 to form the flexible 3D display assembly 800. The flexible 3D display assembly 800 may include pairs 100a, 100b of electrically interconnected light emitting elements 100, each respective pair of light emitting elements optically aligned with a corresponding respective pair of apertures 501a 501b. In some implementations, interior surface portions of substrate 502 of the display bezel 500 proximal light emitting elements 100 may be white so as to reflect any stray light emitted by the light emitting elements 100 that may strike the substrate 502. This reflection can increase the intensity of the emitted light and improve the optical efficiency of the light emitting elements 100.

In the example illustrated in FIG. 1, framing cells 602 of the flexible lattice fixture 600 define back to back triangle shaped openings that correspond to triangular shaped light emitting elements 100. However, lattice fixture 600 can be configured such that the framing cells 602 define openings 601 with other shapes, such as square, circle, rectangle, or any other desired shape. In those instances, the light emitting elements 100 can have a corresponding shape such that one or more light emitting elements 100 can be securely disposed in a corresponding opening 601 defined by a framing cell 602.

In example embodiments, the flexible lattice fixture 600 is formed to include mechanical fixation elements, such as heat stacking, a mechanical click system or screws for affixing the sub-assembly 850 to the substrate 502 of the display bezel 500. In other words, the flexible lattice fixture 600 may provide a fixation system that mechanically couples individual light emitting elements 100 to the display bezel 500 at locations of corresponding apertures 501 on the substrate 502 of the display bezel 500. Thus, the arrangement of apertures 501 on the substrate 502 of the display bezel 500 may be predefined by the arrangement 400 of the framing cells 602 of the flexible lattice fixture 600. The flexible lattice fixture 600 may provide secure mechanical attachment of the subassembly 850 to the display bezel 500 such that respective pairs 100a, 100b of light emitting elements 100 disposed in corresponding respective lattice openings 601 of the framing cells 602 are held in stable optical alignment with respective corresponding pairs 501a, 501b of apertures 501 of the display bezel 500.

The subassembly 850 may include a sufficient number of mechanical supporting structures (not shown) to maintain constant pressure on the subassembly 850 against the display structure 500 when the subassembly 850 is secured to the display structure 500. The result is a flexible 3D display assembly that can be mounted to a curved structure, such as a grille of an automobile, while maintaining the optical alignment of its optical components.

Figure 2:
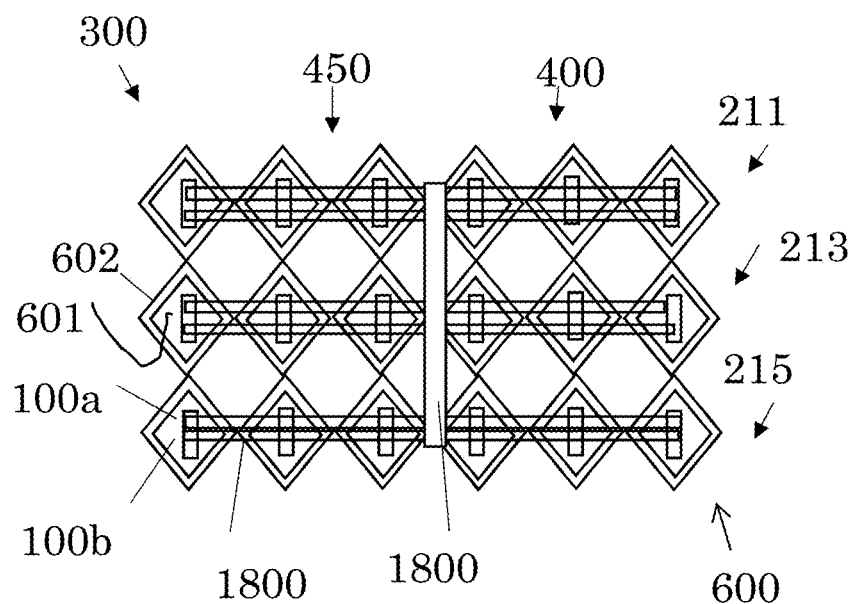
FIG. 2 is a plan view of a system of electrical conductors that interconnects light emitting elements in the flexible display assembly of FIG. 1.

FIG. 2 is a plan view of a system of conductors 300. The system 300 may include multiple interconnected individual conducting segments 1800. Individual conducting segments 1800 may extend from one light emitting element 100 to another, or from one pair of light emitting elements to another pair of light emitting elements. Alternatively, individual conducting segments 1800 can extend along a string of light emitting elements 100.

Individual conducting segments 1800 are interconnected to form clusters 400, 450 of light emitting elements to which conducting segments 1800 deliver power, data and control signals. In the example shown, the cluster 400 includes three strings 211, 213, 215 of lighting elements 100 in which each string includes three pairs of lighting elements 100 (one pair indicated at 100a, 100b) electrically connected by corresponding conducting segments 1800. Each cluster may include a total of 18 light emitting elements, each string including 6 elements 100. Likewise, a second cluster 450 may include three strings of light emitting elements 100.

Clusters 400 and 450 may themselves be interconnected by conducting segments 1800 arranged to provide a common bus that conveys power, data and control signals to each string of light emitting elements in a corresponding cluster. Individual conductor elements 1800 can include wires or cables as described below. In some embodiments, conductor elements 1800 may be provided within structural elements of the flexible lattice fixture 600. In those embodiments, the flexible lattice fixture 600 itself may include a system of conductors 300.

For example, in some embodiments, electronic components may be disposed within portions of the flexible lattice fixture so as to be in contact with individual ones of the light emitting elements 100 via contacts on a corresponding PCB 170. In some examples, electrical contact elements, such as a leadframe or spring contacts, may be formed as part of the injection molding process by which the flexible lattice fixture 600 is formed or built up. In other examples, electrical contact elements may be placed after injection molding on corresponding receptacles formed in the flexible lattice fixture 600 during injection molding. For example, after injection molding of flexible lattice fixture 600, electrical contact elements may be placed or clipped into or onto portions of the flexible lattice fixture 600. In some examples, electrical contact elements and/or electrical or electronic components such as controller chips may be disposed within the light emitting elements 100 when the light emitting elements 100 are formed.

Figure 3:
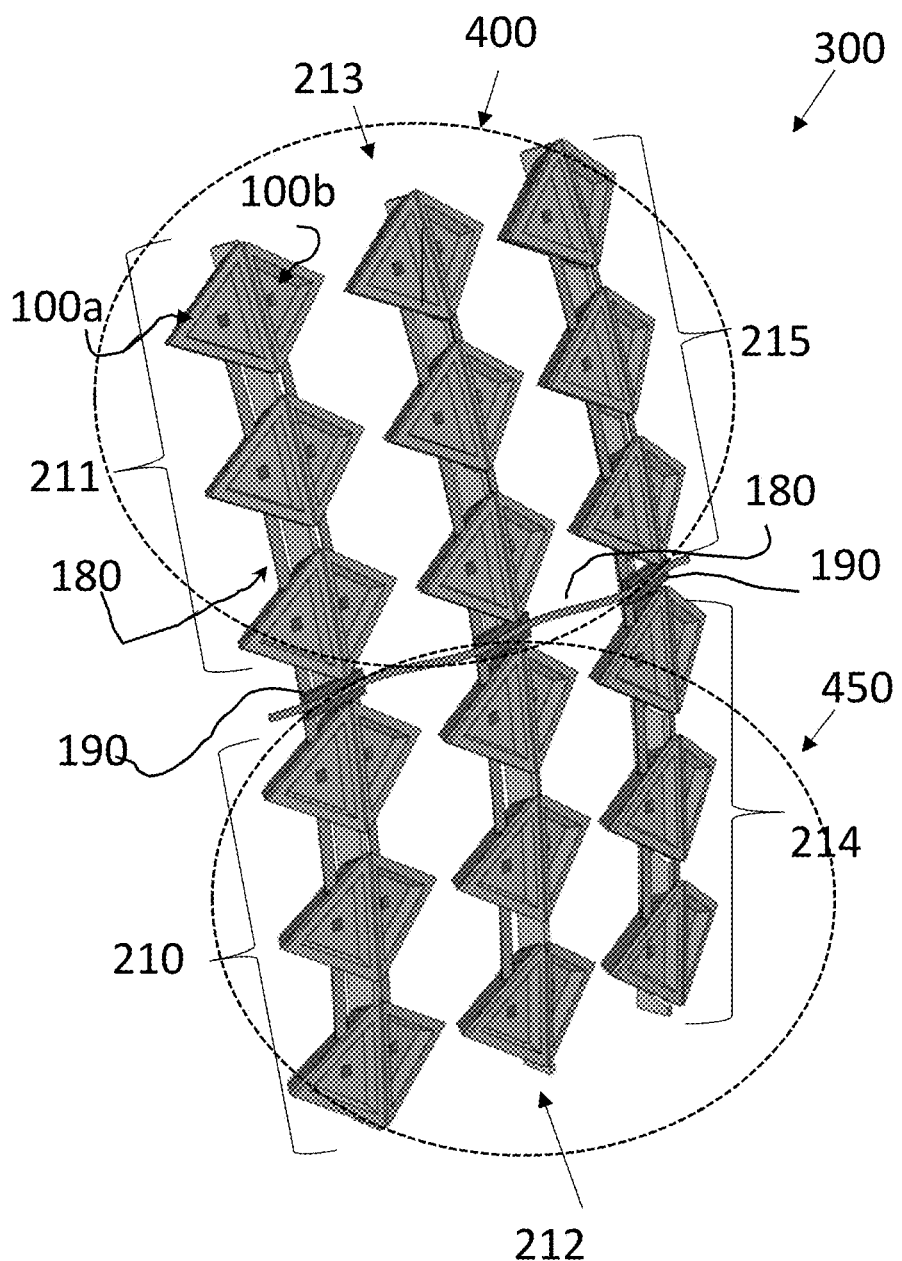
FIG. 3 is a perspective view of an arrangement of light emitting elements in one example of the flexible display assembly of FIG. 1.

FIG. 3 is a perspective view of clusters 400, 450 of electrically interconnected light emitting elements 100 according to one example of a 3D flexible display assembly 800. Each cluster may include multiple strings of light emitting elements 100. For example, the cluster 400 includes strings 211, 213 and 215 of light emitting elements 100. In the illustrated example, each string includes six light emitting elements, or three pairs (e.g., 100a 100b) of light emitting elements 100. A second cluster 450 may include three strings 210, 212 and 214 of light emitting elements 100, each string including six light emitting elements 100 (or three pairs 100a, 100b) of light emitting elements 100.

In the example illustrated in FIG. 3, the light emitting elements 100 in each string are electrically connected by conductor segments (1800) including one or more flexible printed circuit boards 180. The strings comprising each cluster may themselves be interconnected by one or more conducting segments including a flexible printed circuit board 180. Each string can be driven by at least integrated circuit (IC) 190 implementing a driver. Each driver IC 190 may electrically drive and control each surface emitter 100 of the string 100 individually or may drive and control the string 200 collectively.

Figure 4:
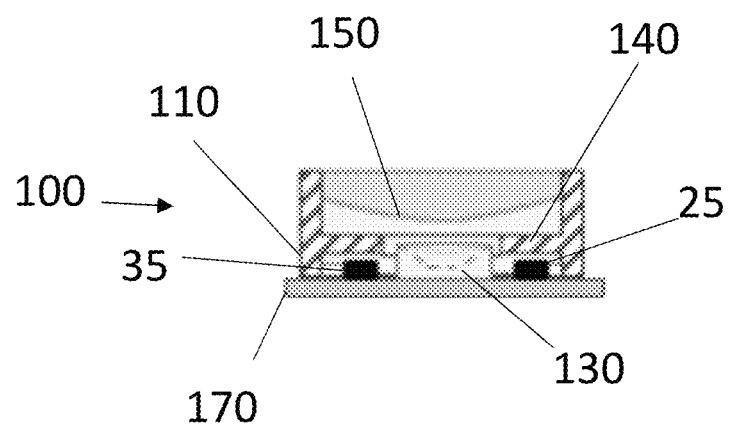
FIG. 4 is an elevation view of a light emitting element in one example of the flexible display assembly of FIG. 1.

FIG. 4 is an elevation view of one example light emitting element 100 that includes the arrangement of electrically interconnected light emitting elements 100 illustrated in FIG. 1. The configuration illustrated in FIG. 2 is one of several light emitting element 100 configurations that can comprise the electrically interconnected light emitting elements 100 shown in FIG. 1.

As shown in FIG. 4, the light emitting element 100 includes a mixing box 110 in which a light source 130 is disposed. In some examples, the mixing box 110 is molded from silicone substantially filled with TiO2. The light source 130 can include one or more light emitting diodes (LEDs) each having an anode and a cathode (not visible in FIG. 2) to deliver power to the light source 130 to cause emission of light therefrom.

The light emitting element 100 may further include a printed circuit board 170 coupled to a mixing box 110. The printed circuit board 170 can be a rigid printed circuit board including an anode terminal and a cathode terminal 25. The anode and cathode of the light source 130 can be electrically coupled to the anode terminal 35 and the cathode terminal 25 respectively of first printed circuit board 170.

A transparent layer 140 may be disposed in the mixing box 110 adjacent the light source 130. In some embodiments, the transparent layer 140 includes a layer of transparent silicone material. The transparent layer 140 may be molded, for example vacuum molded, in the mixing box 110, such that the light source 130 is in optical contact with the transparent layer 140 without an air gap between the light source 130 and the transparent layer 140.

In some implementations, the light emitting element 110 further includes a partial transparent scattering or diffusing layer 150 disposed in the mixing box 110 adjacent the transparent layer 140. The diffusing layer 150 may form a light emitting surface at an open end of the mixing box 110. The diffusing layer 150 can be configured to define a desired lateral luminance distribution of light emitted by the light source 130. In some embodiments, the light diffusing layer 150 may be molded or cast to shape the diffusing layer 150 prior to disposing the diffusing layer 150 in the mixing box 110. In some embodiments, the layers 140, 150 may be configured with respect to color, transparency, scattering particles, shape, thickness, and location so as to produce a substantially Lambertian emission and to provide a substantially homogeneous appearance.

Figure 5:
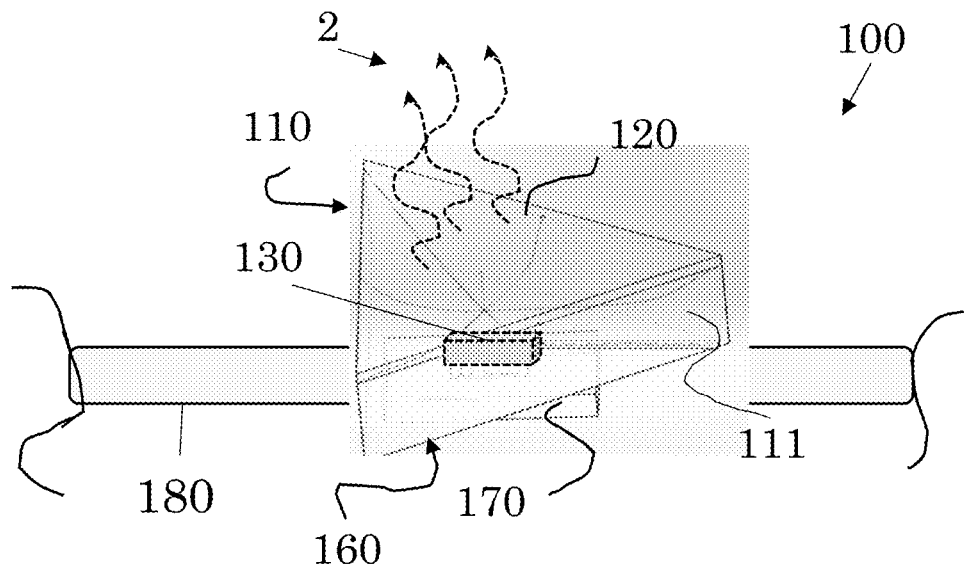
FIG. 5 is a perspective view of an example light emitting element disposed on an electrical conductor in one example of light emitting elements comprising the flexible display assembly illustrated in FIG. 1.

FIG. 5 is a perspective view showing a light emitting top surface 120 of the mixing box 100 of the light emitting element 100 shown in FIG. 4. As noted above with respect to FIG. 4, the mixing box 100 is defined by sides 111 (one visible in FIG. 5), an open end 120 including a light emitting surface, and an opposing closed end 160. The mixing box 110 may be coupled at the closed end 160 to the first printed circuit board (PCB) 170, which can be a rigid printed circuit board. In the example illustrated in FIG. 5, a conductor element 1850 (shown in FIG. 2) includes a flexible printed circuit board (FPCB) 180. The first PCB 170 may be configured by conducting portions (not shown in FIGS. 5 and 6) that couple electrodes of the light source 130 to corresponding conducting portions of the FPCB 180 when the PCB 170 is coupled to the mixing box 110 and the FPCB 180.

As discussed above with respect to FIG. 4, the light 2 from the light source 130 propagates through the transparent layer 140 and the light diffusing layer 150 of the mixing box 110. Light 2 may exit the mixing box 110 through the exit surface 120 of the light diffusing layer 150. Light 2 exiting the mixing box 110 may propagate through a corresponding aperture 501 in the display bezel 500 (best illustrated in FIG. 1) by optical alignment of the light emitting element 100 with a corresponding aperture 501 of the display bezel 500 when the flexible framing fixture 600 is affixed to the display bezel 500. In some embodiments, surface portions of the display bezel 500 are configured to reflect the emitted light back toward one or more of the surface portions of the mixing boxes 110. In that manner, the display bezel may recycle stray emitted light, thereby increasing optical efficiency of the light emitting elements and contributing to the intensity of light propagating from display bezel 500.

Figure 6:
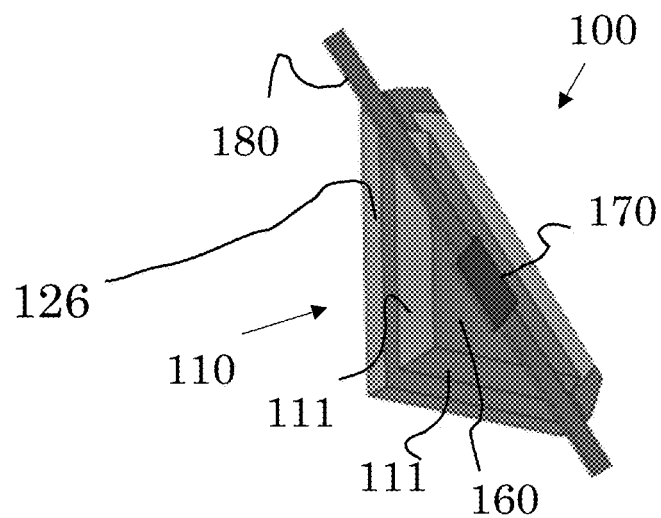
FIG. 6 is a perspective view of the example light emitting element of FIG. 5 from a different perspective.

FIG. 6 is a perspective view of the mixing box 110 showing a bottom surface 160 of the mixing box 110 illustrated in FIG. 5. The mixing box 110 may include light reflecting sides 111 having top edges (not visible in FIGS. 5 and 6) formed to define a lip 126 that encompasses a perimeter of the open end 120 of the mixing box 110. The lip 126 extends outwardly from, and substantially perpendicular to, the sides 111.

Figure 7:
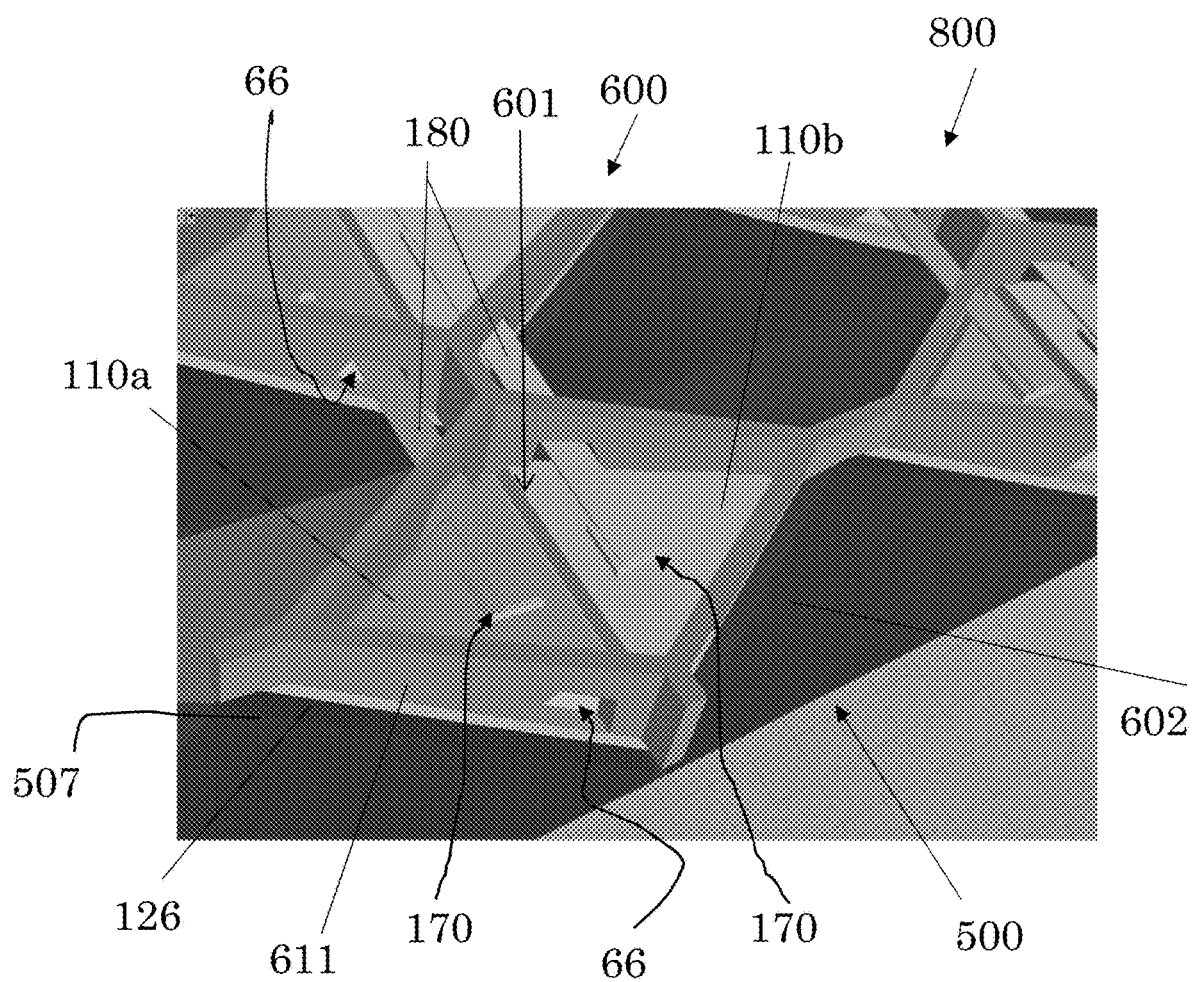
FIG. 7 is a perspective view of a portion of the flexible display assembly of FIG. 1.

FIG. 7 is a perspective view of a portion of the flexible display assembly 800. As shown in FIG. 7, each framing cell 602 may include sides 611. As illustrated in FIG. 7, when a pair 110a, 110b of light emitting elements 100 is disposed in a corresponding opening 601 of a framing cell 602, and the flexible lattice fixture 600 is affixed to the display bezel 500, an edge of a framing cell 602 may engage an inner surface of the lip 126 to press an outer surface of the lip 126 against an inner surface 507 of the display bezel substrate 502.

Each framing cell 602 may be formed to define corresponding openings 66 that can accommodate conductors 1800 (illustrated in FIG. 2) such as wires, cables or the FPCB 180 that extend between light emitting elements 100 to electrically interconnect light emitting elements 100 in strings and/or clusters (best illustrated in FIGS. 1 and 3). Thus, the flexible lattice fixture 600 may structurally support a system of conductors 300 that may interconnect multiple electrically interconnected light emitting elements while structurally supporting the light emitting elements themselves in an arrangement defined by framing cells 602.

In some examples, framing cell structural portions and other structural portions of the flexible lattice fixture 600 may be formed to integrate power supply, ICs implementing drivers, controllers and other electronic components that cooperate to control light sources 130 to produce various lighting patterns on the display bezel 500 when the flexible display assembly 800 is mounted to a structure, such as a grille surface portion of an electric vehicle.

The resulting flexible display assembly 800 may provide lighting elements, electrical interconnections and control components in a form that is ready for attachment to a surface of a structure that will bear the display assembly, such as a grille area of an electric vehicle. The flexible display assembly 800 can form visibly distinct display lighting patterns when installed on the surface of the structure and suppled with power. Advantageously, the flexible display assembly 800 can flex to conform itself to curved surfaces, such as a curved surface in a grille area of an electric vehicle body.

FIG. 8 illustrates a light emitting element 100 including a light source 130 disposed in a mixing box 110 and including a PCB 170 as described with respect to FIG. 4. The light source 130 may include an anode terminal and a cathode terminal (not visible in FIG. 8) connected respectively to corresponding terminal pads formed on a bottom surface 160 (best illustrated in FIG. 5) of the light box 110.

In some embodiments, an integrated circuit (IC) implementing a driver and/or a controller may be disposed within the mixing box 110 and coupled to the light emitting element 130 to control emission of light therefrom. In some embodiments, such an IC may be disposed on a surface of the PCB 170 and coupled to the light source 130 via contacts provided on a surface of the mixing box 110.

In those embodiments, the bottom surface 126 or other surfaces (not shown) of the mixing box 110 may provide electrical contact pads connected to pins of the integrated circuit. The additional contact pads can deliver data and/or control signals to the integrated circuit, which in turn may control the power delivered to the light source 130 accordingly. In that case, the PCB 170 may include data and/or control terminals (not shown) in addition to anode and cathode terminals 25 and 35.

The anode terminal 35 and the cathode terminal 25, as well as data and control terminals (if any), may be formed on a top surface 171 of the PCB 170. In the embodiment shown in FIG. 8, the anode and cathode terminals on the bottom surface 160 of the light box 110 may be connected to the anode terminal and the cathode terminal 25 respectively of PCB 170 by means of corresponding electrically conductive spring clips 1300. Each spring clip 1300 may extend between a terminal pad on the bottom surface 126 of the light box 110 and a corresponding terminal on a top surface 171 of the PCB 170.

A proximal end 1301 of the spring clip 1300 may be disposed to make electrical contact with the corresponding terminal pad on the bottom surface 126 of the light box 110, while a distal end 1302 may make electrical contact with the corresponding terminal (25 or 35) on the top surface 171 of the PCB 170. In some applications, the proximal portions 1303 of the spring clips 1300 can be disposed between the bottom surface 160 of the light box 110 and a support structure such as a heat sink 1306 disposed between the light source 130 and the PCB 170.

FIG. 9 is a perspective view of a spring clip 1300. FIG. 10 is an elevation view of a spring clip 1300. The spring clip 1300 may include a flexible intermediate portion 1303 that can flex in response to compressive forces applied, for example when pressure is exerted on the light box 110 to press the light box 110 onto the PCB 1700. The spring clip 1300 can be disposed with respect to terminal 25 or 35 of the PCB 170 such that the terminal end 1302 slidingly engages the terminal 25 or 35 without breaking electrical contact, in response to flexing of intermediate portion 1303.

The PCB 170 may be formed to extend conducting portions of the anode terminal 25, cathode terminal 35 and additional terminals (if any) formed on the top surface 171 of the PCB 170 to the bottom surface 172, for example via pins 1305 that extend from the bottom surface 172 of the PCB 170. In such embodiments, wires or cables 1307 may include conducting elements 1800 of a system of conducting elements 300 (shown in FIG. 2). Wires 1307 can be coupled to pins 1305 via connectors 1309.

Figure 11:
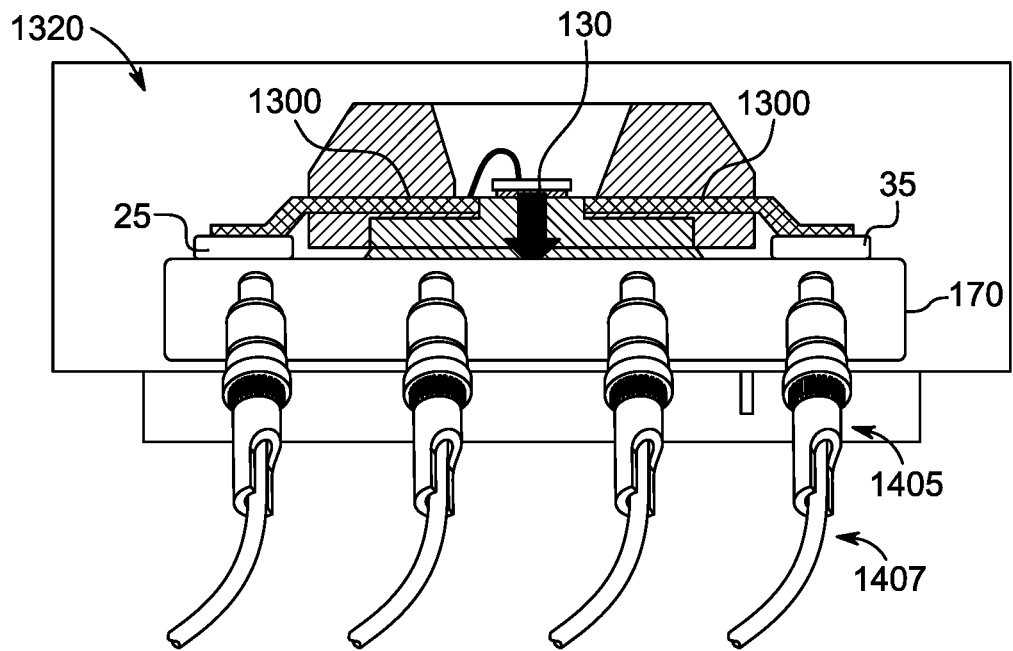
FIG. 11 is a pictorial illustration of an example light emitting element coupled to an electrical conductor in accordance with embodiments described herein.
Figure 12:
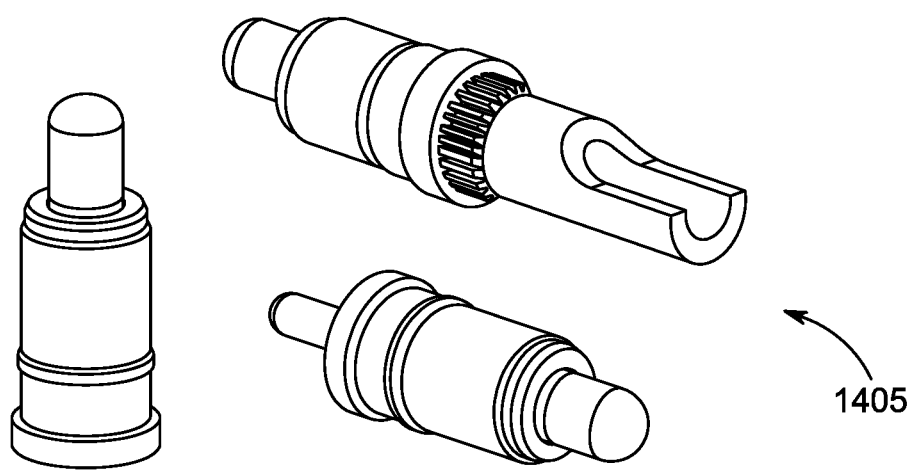
FIG. 12 is a pictorial illustration of compressible pins providing electrical connection in accordance with embodiments described herein.

FIG. 11 shows an alternative embodiment of the light emitting element shown in FIG. 8. In the example illustrated in FIG. 11, the PCB 170 is configured to include spring pins 1405 that extend from terminals formed on top surface 171 of PCB 170 through the PCB 170 and the bottom surface 172 the of PCB 170. In such embodiments, wires 1407 include conducting segments 1800 of system of conductors 300. FIG. 12 shows examples of suitable spring pins 1405.

Figure 13:
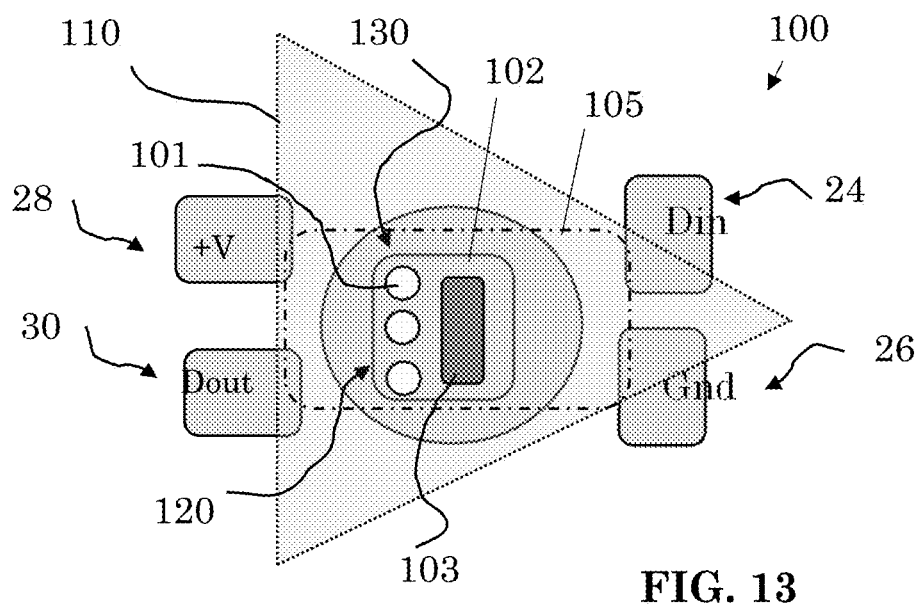
FIG. 13 is a top plan view of a light emitting element according to embodiments described herein.

FIG. 13 is a top plan view looking down on the light emitting top surface 120 of the mixing box 100 including a light emitting element 100 suitable for implementing the display assembly 800 depicted in FIG. 1. The light emitting element 100 may include a light source 130 disposed within the mixing box 110 (also shown in FIG. 5). In the embodiment of FIG. 13, the light source 130 includes one or more LEDs 101 provided as a lead frame package 102. In some embodiments, the lead frame package 102 provides a single LED 101. In other embodiments, the lead frame package 102 may provide multiple LEDs 101, such as a red, a green and a blue LED. The package 102 may include LEDs configured to emit light of any color or combination of colors, or may provide LEDs configured to emit monochromatic light, or white light.

In the illustrated example, the lead frame package 102 includes an integrated circuit (IC) 103, which can be a driver IC and/or a controller IC. In some arrangements, the IC 103 is coupled to either an anode or a cathode of the LED 101 to provide power in accordance with a power control signal that pulses the LED on and off in accordance with a pulse width modulation (PWM) scheme in which the length of the 'on' time with respect to the 'off' time determines the brightness of the LED. In some embodiments, the LED package 102 can include more than one driver or controller IC, such as one driver IC for each LED 101 comprising package 102. In other embodiments, the LED package 102 does not include a driver or controller IC.

In some embodiments, each lead frame package 102 provides leads 24, 26, 28 and 30 for electrically connecting the light emitting element 100 to components external to the mixing box 110. For example, in the embodiment shown in FIG. 13, leads 24, 26, 28 and 30 connect to corresponding leads provided by the flexible lattice fixture 600 so as to connect the lead frame package 102 to a source of operating power and a driver and/or controller IC 103. Leads 24, 26, 28 and 30 of the lead frame 105 need not be provided in the same arrangement shown in the example of FIG. 13. Those of ordinary skill will, upon reading this specification, appreciate that a variety of suitable configurations of LED packages 102 and lead frame 105 structures and arrangements may be suitable for implementing the embodiments described herein. These may include arrangements in which leads 24, 26, 28 and 30 are configured to connect to corresponding leads external to the mixing box 110 via connections formed on one or more exterior surfaces of the mixing box 110. In some embodiments, the lead frame 105 may provide only two leads, one a supply and the other a return.

Figure 14:
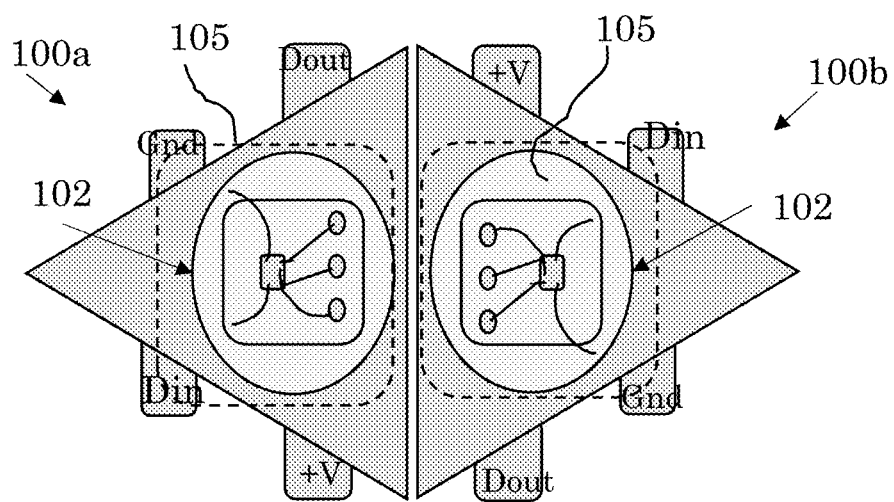
FIG. 14 is a top plan view of a pair of light emitting elements according to embodiments described herein.

FIG. 14 shows two each of light emitting element 100 shown in FIG. 13 to provide a pair 100a, 100b of light emitting elements (also illustrated in FIG. 1). The light emitting elements 100a and 100b are shown to be arranged as they would appear when disposed in a framing cell 602 of the flexible lattice fixture 600 (shown in FIG. 1). Each light emitting element 100 may include a lead frame package 102 that provides a lead frame 105 comprising a set of leads 24, 26, 28 and 30.

Figure 15:
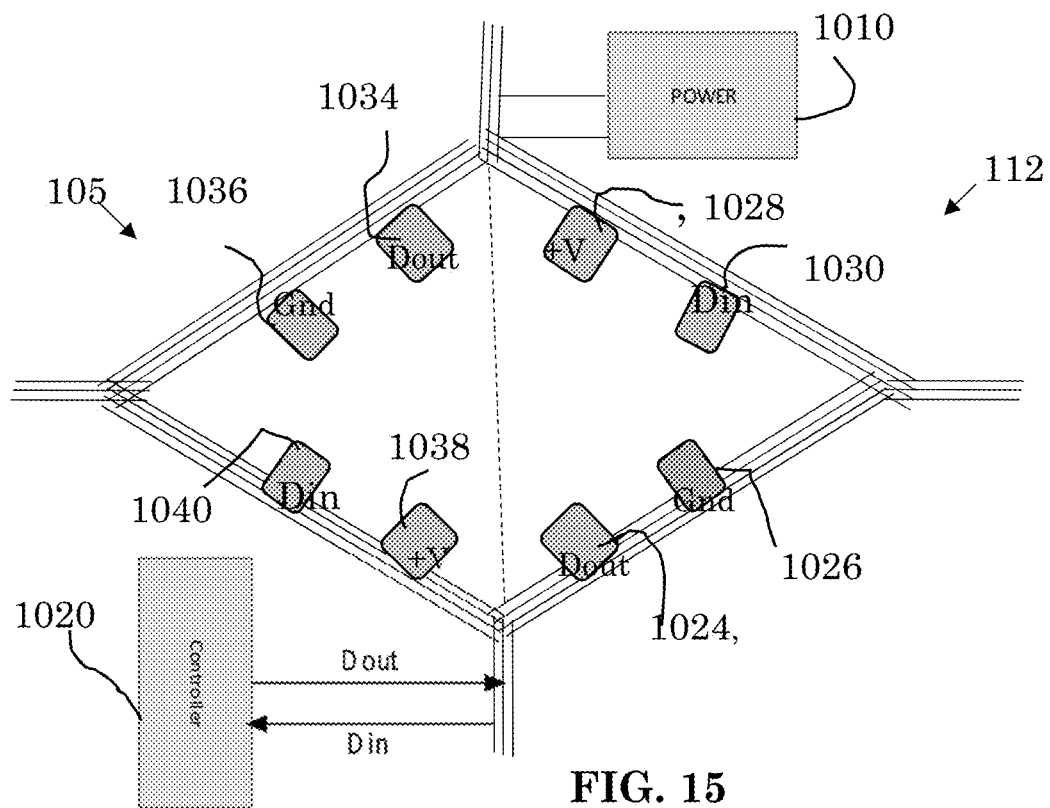
FIG. 15 is structural diagram showing a portion of a lead frame assembly according to embodiments described herein.

FIG. 15 is top plan view of a portion of an example second lead frame assembly 112. Unlike the first lead frame 105 of the lead frame package 102, the second lead frame assembly 112 is external to the light emitting element 100 and lead frame package 102. The second lead frame assembly 112 may include one or more physically separated and electrically isolated electrical conductors that extend essentially in parallel and are formed as an integral structure that corresponds generally in shape and dimension to the shape and dimension of the flexible lattice fixture 600. In some embodiments, the lead frame assembly can include more than one piece so that pieces can be coupled to those portions of the flexible lattice fixture 600 where lead frame connections are desired. In some embodiments, the lead frame assembly 112 can be formed as an integral part of the flexible lattice 600 during molding of the flexible lattice 600.

The second lead frame assembly 112 may be structured to be coupled to the flexible lattice fixture 600 so as to provide electrical connections between the light emitting elements 100 disposed within the framing cells 602 and to connect to external components, such as a power source 1010 and a controller 1020 to thereby distribute power and control signals to the light emitting elements in the structural arrangement defined by the flexible lattice fixture 600. For example, the second lead frame assembly 112 may provide terminal end portions or leads 1024, 1026, 1028 and 1030 about each framing cell 602. When light emitting elements 100 are disposed in each framing cell, leads provided by the first lead frame 105 can be connected to corresponding leads 1024, 1026, 1028 and 1030 provided by the second lead frame 112 so as to electrically interconnect light emitting elements 100 disposed in the flexible lattice fixture 600, when the flexible lattice fixture 600 is coupled to the display bezel 500 to form the display assembly 800.

Figure 16:
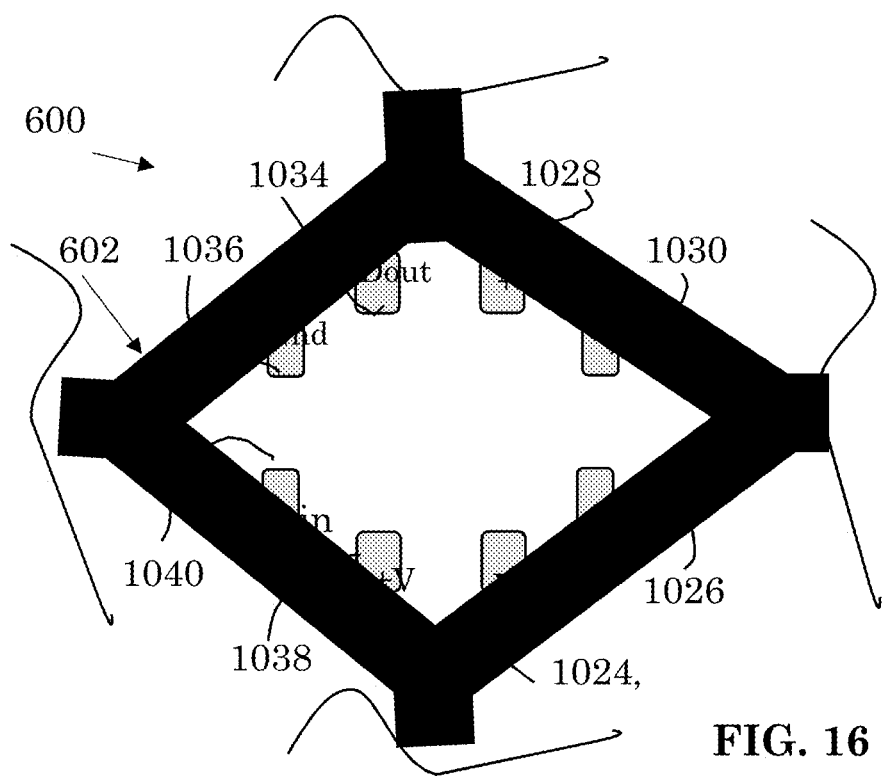
FIG. 16 is a structural diagram of a framing cell including the lead frame assembly shown in FIG. 15.
Figure 17:
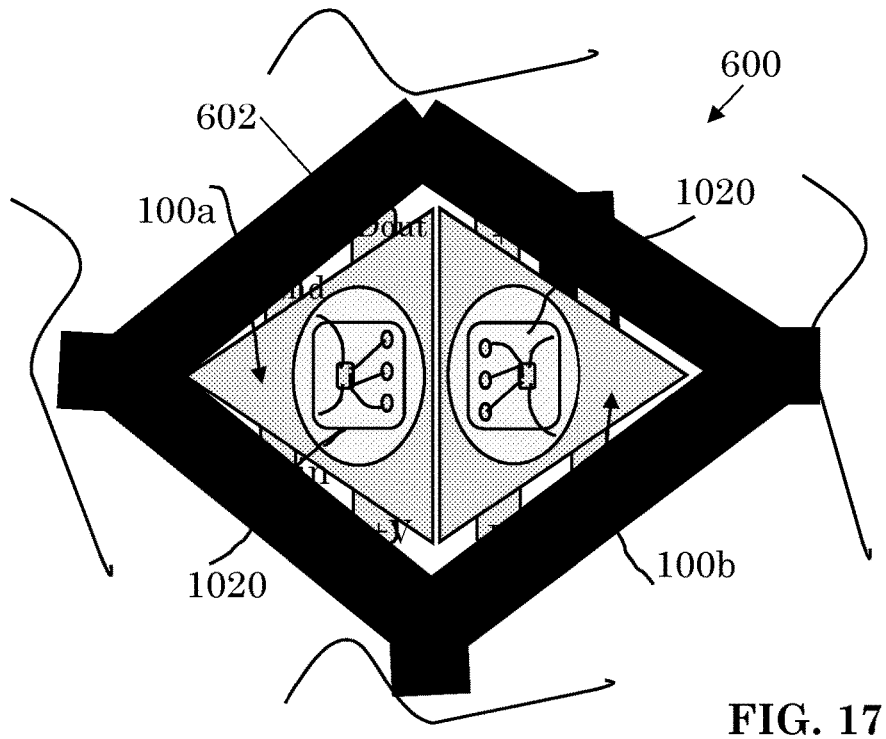
FIG. 17 is a top plan view of the pair of light emitting elements shown in FIG. 14 disposed in the framing cell of FIG. 15.

FIG. 16 shows a framing cell 602 of the flexible lattice fixture 600 in which the lead frame assembly 112 shown in FIG. 15 is disposed, for example by molding the lead frame assembly 112 into the flexible lattice fixture 600 as the flexible lattice fixture 600 is produced. In alternative embodiments, the lead frame assembly 112 may be coupled to the flexible lattice fixture 600 after the flexible lattice fixture 600 is formed. FIG. 17 shows the framing cell 602 shown in FIG. 15 with a pair of light emitting elements 100a, 100b disposed therein.

Figure 18:
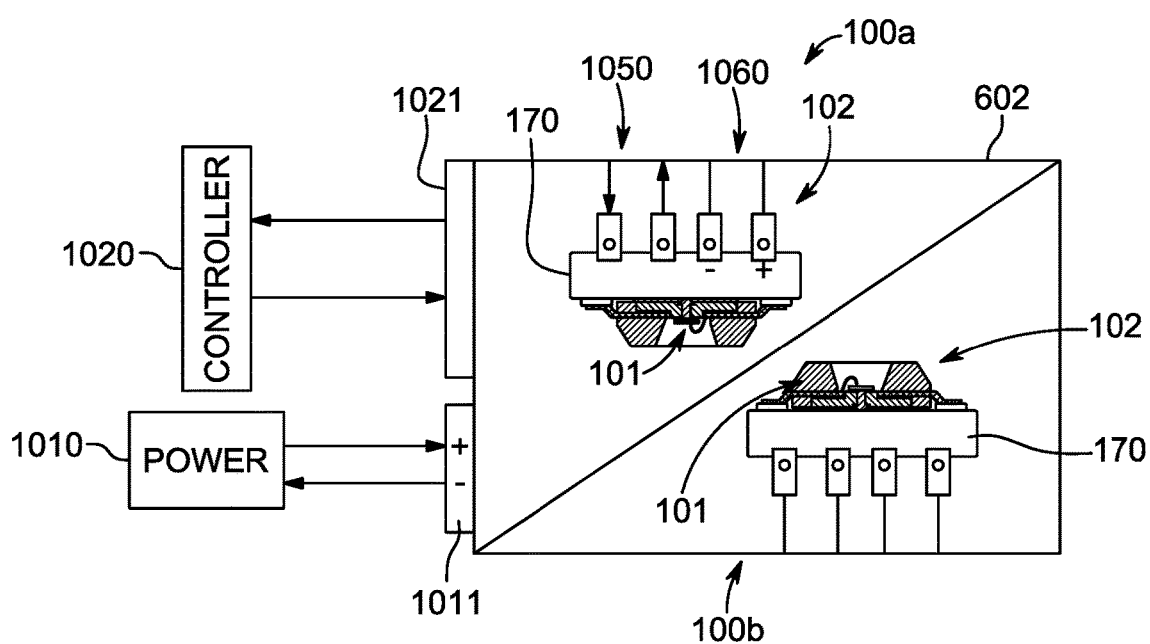
FIG. 18 is a functional diagram showing power and control interconnections for an example framing cell of a flexible lattice according to embodiments described herein.

FIG. 18 is a functional diagram showing power and control interconnections via wire frame interconnections between a controller IC 1020 and a power supply 1010 and a pair of light emitting elements 100a, 100b. Each of the light emitting elements 1001, 100b may include an LED package 102 disposed on a rigid printed circuit board 170. In the example shown, the lead frame 112 is configured so that leads correspond to leads or connectors provided on the rigid printed circuit board 170, while corresponding conductors comprising the lead frame 112 are coupled to the controller IC 1020 and the power supply IC 1010 via first and second ports 1020 and 1011 formed on, or attached to, a lead frame assembly 112 (not visible), which may be coupled to, or embedded within, the flexible lattice fixture 600 and distributed to the framing cell 602.

In some embodiments, either or both the IC 1020 and 1010 can be disposed within the flexible lattice fixture 600 or formed within the flexible lattice fixture 600 during molding. In other embodiments, the IC 1020 and/or the IC 1010 may be disposed within the flexible lattice fixture 600 and coupled to an external source of power such as a vehicle battery, and/or coupled to a user interface by which a user can configure the controller 1020 to control the LEDs 101 of the light emitting elements 100 according to user preferences.

Figure 19:
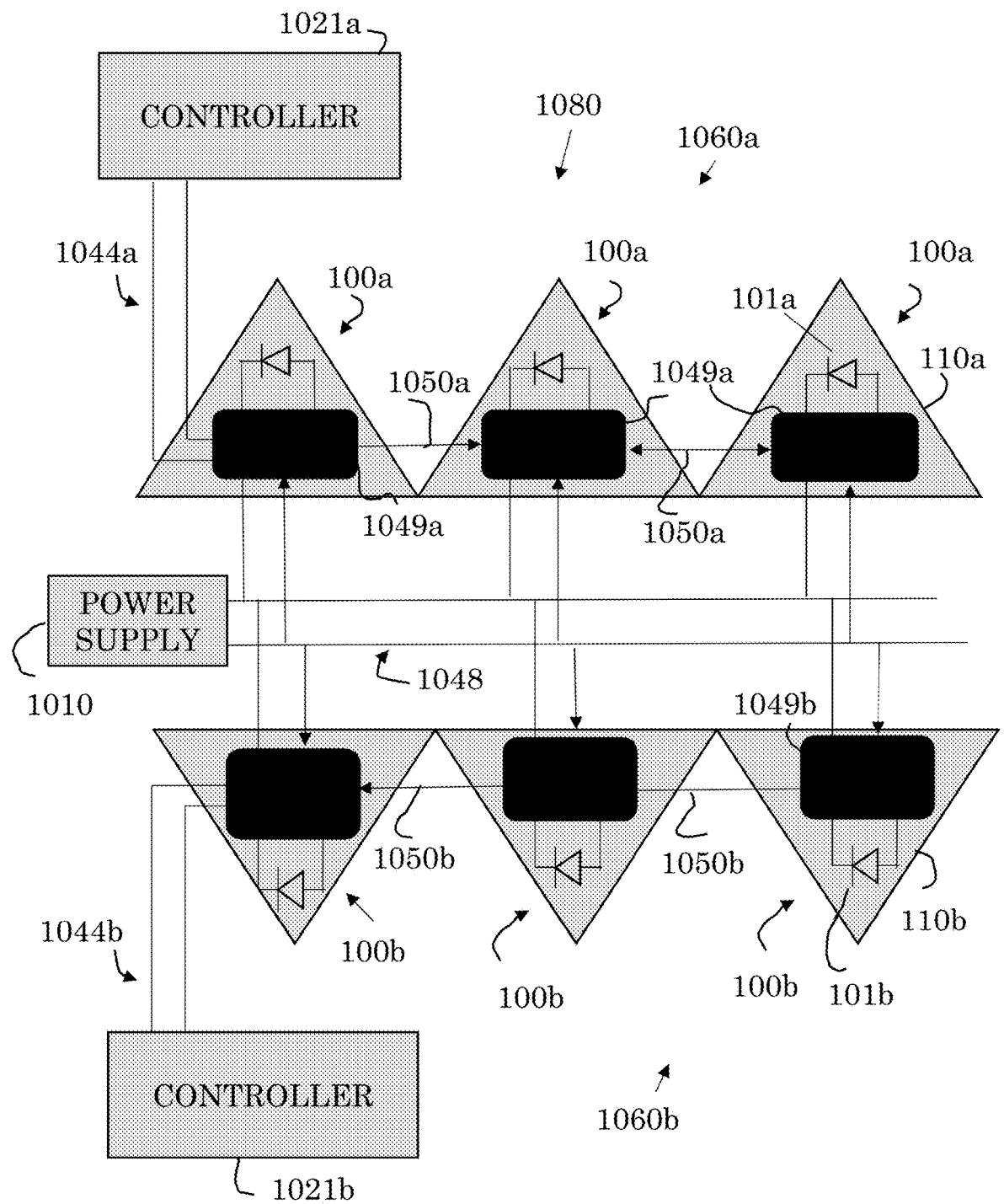
FIG. 19 is a functional structural diagram illustrating a string of light emitting elements arranged according to embodiments described herein.

FIG. 19 is a structural diagram illustrating a string 1080 of light emitting elements 100 according to an example embodiment. In this example, the string 1080 may include a first half 1060a and a second half 1060b. Each half string may include three pairs (e.g., each pair comprising 100a, 100b illustrated in FIG. 1) of light emitting elements 100 for a total of six light emitting elements 100 in a string 1080. For example, the half string 1060a may include three adjacent light emitting elements 100a. Each light emitting element 100a may include at least one corresponding LED 101a disposed in a corresponding mixing box 110a. Each light emitting element 100a may further include a corresponding driver IC 1049a coupled to the anode and/or or cathode of the corresponding LED 101a.

Each driver 1049a may be coupled to a driver 1049a of an adjacent light emitting element 100a by one or more conductors 1050. The conductors 1050 may convey control signals and/or data between the drivers 1049. The drivers 1049 may switch power to corresponding LEDs 101 in accordance with the control signals, in accordance with a pulse width modulation (PWM) scheme to adjust the brightness of the corresponding LEDs 101a. A driver 1049a at one end of the string half 1060a may be coupled to receive control signals from the string half controller 1021a conveyed by one or more conductors 1044a. In some embodiments, each of the LEDs comprising light emitting elements 100 may be individually addressable by the signals conveyed by the conductors 1050a, 1050b.

A power supply 1010, which can be provided as an integrated circuit, may supply an operating voltage and a return to each driver 1049a in the string half 1060a as well as each driver 1049b in the string half 1060b via conductors 1048. The string half 1060b may include an arrangement of light emitting elements 100b, LEDs 101b, drivers 1049b and a controller 1021b. In some embodiments, the power supply 101 and/or the controller ICs 1021a, 2021b can be embedded within or coupled to portions of the flexible lattice fixture 600 (shown in FIG. 1).

In some embodiments, the conductors 1048 may be provided by a wireframe sub-assembly 112 (illustrated, for example, in FIG. 15) that may be disposed in the flexible lattice fixture 600 (illustrated in FIG. 16), while conductors 1050a and 1050b may be provided as wires (for example illustrated in FIG. 8) or implemented via one or more flexible printed circuit board (illustrated in FIG. 7). In other embodiments, conductors 1048 as well as conductors 1050a and 1050b may be provided by a wireframe. In still other embodiments, conductors 1048, 1050a and 1050b may include wires. The display assembly 800 can be implemented by any combination of wires, flexible printed circuit boards and or wireframe leads coupled to the flexible lattice fixture 600.

Figure 20:
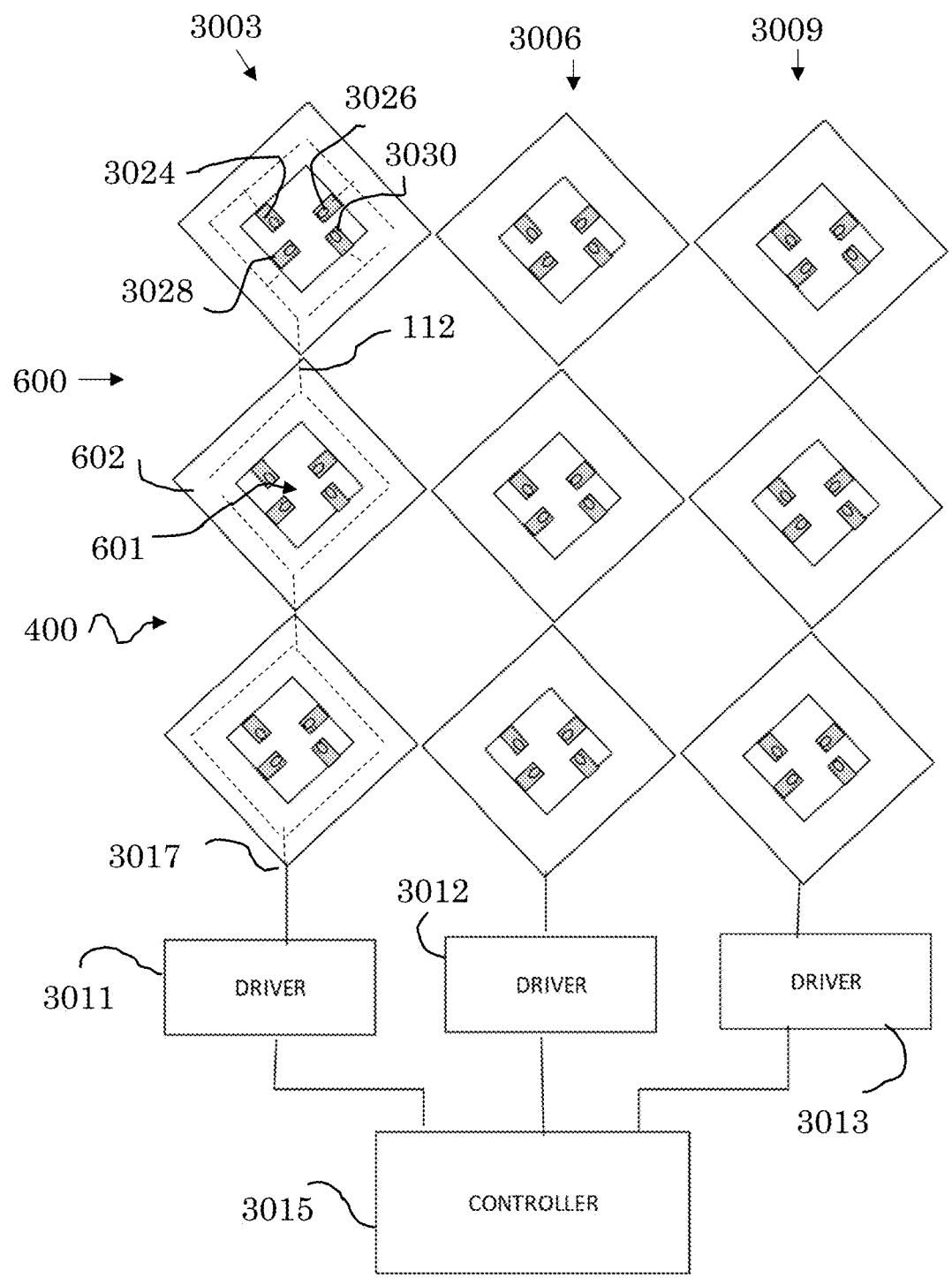
FIG. 20 is a functional structural diagram illustrating a cluster of light emitting elements according to embodiments described herein.

FIG. 20 is a structural functional diagram illustrating a flexible lattice fixture 600 comprising three columns 3003, 3006, 3009 of framing cells 602, each framing cell 602 configured to receive a corresponding pair of LEDs (illustrated in FIG. 1 at 100a, 100b). The flexible lattice fixture 600 may include an embedded wire frame assembly 112 that extends throughout framing cells 602 and along each column 3003, 3006, 3009 of flexible lattice fixture 600. The wire frame 112 may be formed so as to provide each framing cell 602 with multiple leads 3024, 3026, 3028 and 3030 for connecting to corresponding leads provided by wire frames 115 of corresponding light emitting elements (not shown in FIG. 20).

When light emitting elements are disposed in corresponding framing cells 602, the flexible lattice arrangement shown in FIG. 20 may define a cluster 400 of light emitting elements 100. The cluster 400 may include three strings corresponding to columns 3003, 3006 and 3009. Each string may include 6 light emitting elements 100 (not shown in FIG. 20). In the example shown in FIG. 20, a driver IC 3011 is coupled to wire frame conductors extending along the column 3003. The IC 3012 may be coupled to wire frame conductors extending along the column 3006, and the IC 3013 may be coupled to wire frame conductors extending along the column 3009. A cluster controller 3015 may be coupled to drivers 3011, 3012 and 3013 to coordinate control of light emitting elements 100 across the strings.

In the embodiment illustrated in FIG. 20, the wire frame 112 provides two conductors (not individually depicted) to each light emitting element 100, such as one conductor to supply an operating voltage and another to provide a return. However, in other embodiments, the wire frame 112 can include more than two conductors, such as four or six individual conductors that connect to components that supply control and/or data signals to integrated circuits (ICs) including a corresponding LED package 1320 (illustrated in FIGS. 8 and 11). The wire frame 112 may be formed such that each conductor includes a terminal portion forming a lead (e.g., 3024, 3028) that extends into the opening 601 of each framing cell 603 when a light emitting element 100 is disposed in a corresponding framing cell portion.

Figure 21:
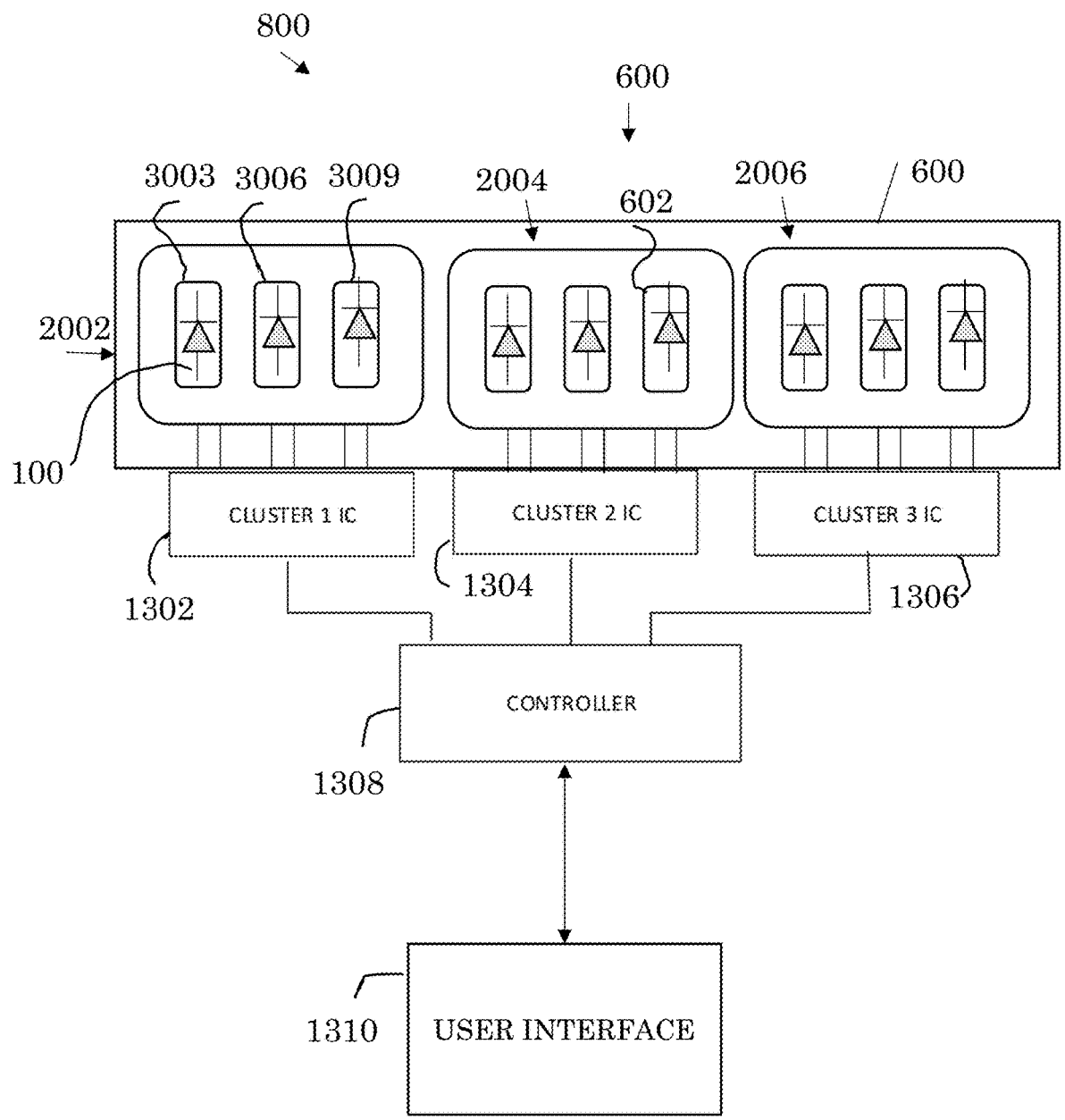
FIG. 21 is a block diagram illustrating an arrangement for interconnecting clusters of light emitting elements to control elements according to embodiments described herein.

FIG. 21 is a functional block diagram of the flexible lattice fixture 600 configured to implement three clusters 2002, 2004, 2006 of light emitting elements 100. Each cluster may correspond to the cluster 400 shown in FIG. 20. As shown in FIG. 21, each cluster may include three strings, (e.g., 3003, 3006, 3009), each string including three pairs of LEDs 100 (example pair illustrated in FIG. 1 at 100a, 100b). Each cluster 2002, 2004, 2006 may be controlled by a respective corresponding cluster controller IC 1302, 1304, 1306. A master controller 1308 may be coupled to cluster controllers 1302, 1304, 1306 to coordinate illumination of the LEDs across the cluster controllers. In some embodiments, cluster controllers 1302, 1304, 1306 may be configured to individually control each string 3003, 3006, 3009. In other embodiments, cluster controllers 1302, 1304, 1306 may be configured to individually control each LED 100 comprising the display assembly 800. In some embodiments, a user interface 1310, which may be a graphical user interface, may be provided to allow a user to configure various illumination parameters and patterns of the LEDs comprising display assembly 800.

Figure 22:
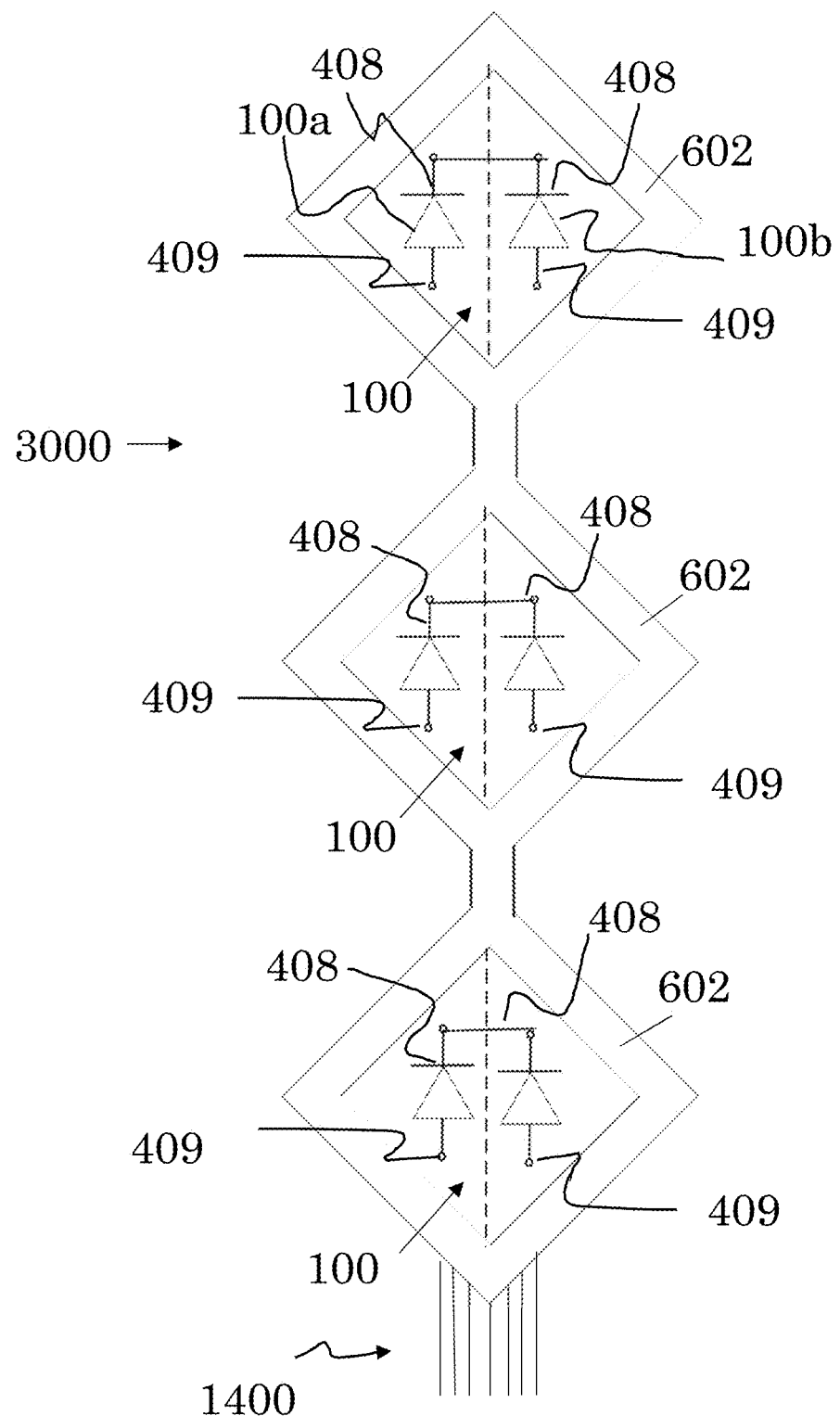
FIG. 22 is top plan view of example framing cells of a flexible lattice fixture including a lead frame in embodiments described herein.

FIG. 22 is a top plan view of a string 3000 of light emitting elements 100 including three pairs 100a, 100b of LEDs, each pair disposed in a respective corresponding framing cell 602. As shown in FIG. 22, the cathodes 408 of LEDs 100a, 100b of each pair may be connected in common to define a common cathode configuration. In this configuration, each of the six LEDs comprising the string 3000 can be separately controlled. For example, each LED can be separately controlled by signals suppled separately to each anode 409 of each of the 6 LEDs comprising the string 3000.

A conductor system 1400 can include seven electrically isolated conductors. In some embodiments, the conductor system 1400 can include a lead frame. One of the seven conductors can be connected in common with the common cathodes in each cell 602 to provide a common cathode supply or return path. Each of the other six conductors can be connected to a respective corresponding anode 409 of the six LEDs comprising the string 3000 to provide a separate conduction path for each of the LEDs. This configuration may allow separate control for each of the LEDs. In other words, each LED in the string 3000 can be individually controlled separately from every other LED in the string 3000, such as by interrupting selected ones of the individual conduction paths in accordance with a corresponding PWM scheme that determines the brightness or intensity level of the light emitted by the corresponding LED. For example, each LED in the string 3000 can be separately controlled to have a brightness or intensity level that differs from that of every other LED in the string 3000.

What is claimed is:
1. A display assembly comprising:
a plurality of light emitting elements;
a flexible lattice defined by a plurality of structurally interconnected framing cells, each framing cell configured to receive at least one light emitting element, of the plurality of light emitting elements, such that the plurality of structurally interconnected framing cells distribute the plurality of light emitting elements over the flexible lattice in a first arrangement of light emitting elements;
a display bezel providing an arrangement of apertures corresponding to the first arrangement of light emitting elements;

a plurality of conductors electrically coupling respective subsets of the plurality of light emitting elements together in strings, wherein groups of the strings are arranged in clusters; and a common bus, extending between adjacent clusters in a direction perpendicular to the strings, to provide power and control signals to each of the adjacent clusters, the flexible lattice and the display bezel configured to be interconnected so as to maintain the plurality of light emitting elements in optical alignment with the apertures when the display assembly is disposed on a curved surface of a vehicle.

2. The display assembly of claim 1, wherein the system of conductors comprises a first lead frame assembly comprising a plurality of linearly extending conductors, the first lead frame assembly configured to conform to a shape of the flexible lattice, the conductors providing a plurality of leads extending into each framing cell so as to permit contact with corresponding leads of a second lead frame comprising an LED package comprising the corresponding at least one light emitting element.

3. The display assembly of claim 2, wherein the LED package is mounted on a rigid printed circuit board and electrically coupled to a terminal of the rigid printed circuit board by a flexible contact strip that extends between a lead of the LED package and the terminal, the flexible contact strip configured to slidably engage the terminal in response to a flexing force applied to an intermediate portion of the flexible contact strip.

4. The display assembly of claim 2, wherein each light emitting element comprises a rigid printed circuit board having compressible pins mechanically coupled thereto, each compressible pin comprising:

a proximal end portion that extends from the printed circuit board perpendicular to a surface of the printed circuit board to retractably engage corresponding terminals provided on an outer surface of the mixing box, an intermediate portion that extends from the proximal end through the printed circuit board, and a distal end configured to receive a conductor provided by the flexible lattice.

5. The display assembly of claim 1, wherein each of the plurality of light emitting elements comprises:

a mixing box having at least one light emitting diode (LED) package disposed therein, a layer of light diffusing material defining a light emitting surface of the mixing box, and a layer of transparent material disposed between the light diffusing layer and the at least one LED package.

6. The display assembly of claim 5, wherein the mixing box comprises light reflecting sides having top edges defining a lip that extends about at least a portion of a perimeter of the light emitting surface, the lip extending outwardly from the light emitting surface perpendicular to the light reflecting sides to form an inner lip portion that abuts top edges of a corresponding framing cell when the flexible lattice is coupled to the display bezel.

7. The flexible display assembly of claim 5, wherein the first lead frame assembly is disposed within the flexible lattice.

8. The flexible display assembly of claim 5, wherein the first lead frame assembly is mechanically coupled to the flexible lattice.

9. The flexible display apparatus of claim 5, wherein the mixing box further comprises an integrated circuit coupled to the light emitting diode.

10. The flexible display assembly of claim 1, wherein each of the conductors is a flexible printed circuit board extending between the light emitting elements in each of the strings.

11. The flexible display assembly of claim 1, wherein each of the conductors is a cable or a wire extending between the light emitting elements in each of the strings.

12. The flexible display assembly of claim 1, wherein each of the clusters comprising three strings of electrically interconnected light emitting elements, each string comprising six light emitting elements.

13. The flexible display apparatus of claim 12, further comprising a cluster controller connected to conductors of the system of conductors and configured to coordinate control the light emitting elements across each of the three strings of electrically interconnected light emitting elements.

14. The display assembly of claim 1, wherein:

each of the framing cells comprises a plurality of walls surrounding a respective pair of the plurality of light emitting elements, and each of the walls comprises an opening that receives one of the plurality of conductors.

* * * * *